United States Patent
Yoo

(10) Patent No.: US 10,763,360 B2
(45) Date of Patent: Sep. 1, 2020

(54) FERROELECTRIC MEMORY DEVICE AND METHOD OF MANUFACTURING THE SAME

(71) Applicant: SK hynix Inc., Icheon (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 51 days.

(21) Appl. No.: 15/868,583

(22) Filed: Jan. 11, 2018

(65) Prior Publication Data

US 2018/0286988 A1    Oct. 4, 2018

(30) Foreign Application Priority Data

Mar. 31, 2017  (KR) ........................ 10-2017-0042068

(51) Int. Cl.
| | | |
|---|---|---|
| H01L 27/11507 | (2017.01) | |
| H01L 29/78 | (2006.01) | |
| H01L 29/423 | (2006.01) | |
| H01L 29/51 | (2006.01) | |
| H01L 29/66 | (2006.01) | |
| H01L 21/28 | (2006.01) | |

(52) U.S. Cl.
CPC .. *H01L 29/78391* (2014.09); *H01L 29/40111* (2019.08); *H01L 29/42368* (2013.01); *H01L 29/516* (2013.01); *H01L 29/6684* (2013.01)

(58) Field of Classification Search
None
See application file for complete search history.

(56) References Cited

U.S. PATENT DOCUMENTS

| | | | |
|---|---|---|---|
| 6,906,366 B2 | 6/2005 | Hsu et al. | |
| 7,901,804 B2 | 3/2011 | Hong et al. | |
| 2017/0077317 A1* | 3/2017 | Shimizu | H01L 29/1608 |
| 2017/0162250 A1* | 6/2017 | Slesazeck | H01L 29/78391 |
| 2017/0345831 A1* | 11/2017 | Chavan | H01L 29/40111 |

OTHER PUBLICATIONS

J. Müller, et al. "Ferroelectricity in Simple Binary ZrO2 and HfO2", Nano Lett., 2012, 12 (8), pp. 4318-4323.

* cited by examiner

*Primary Examiner* — Joseph C. Nicely
*Assistant Examiner* — Lamont B Koo

(57) ABSTRACT

A ferroelectric memory device includes a substrate having a source region and a drain region, a first ferroelectric material layer and a second ferroelectric material layer sequentially stacked on the substrate, and a gate electrode layer disposed on the second ferroelectric material layer. The second ferroelectric material layer has an oxygen vacancy concentration different from that of the first ferroelectric material layer.

9 Claims, 11 Drawing Sheets

FERROELECTRIC MEMORY DEVICE AND METHOD OF MANUFACTURING THE SAME

CROSS-REFERENCE TO RELATED APPLICATION

The present application claims priority under 35 U.S.C. 119(a) to Korean Patent Application No. 10-2017-0042068, filed on Mar. 31, 2017, which is herein incorporated by reference in its entirety.

BACKGROUND

1. Technical Field

Embodiments of the present disclosure relate to a ferroelectric memory device and a method of manufacturing the same.

2. Related Art

Generally, a ferroelectric material refers to a material having spontaneous electrical polarization in the absence of an applied external electric field. More specifically, the ferroelectric material can maintain one of two stable remanent polarization states. Thus, a ferroelectric material may be utilized to store information "0" or "1" in a nonvolatile manner.

Because the remanent polarization in a ferroelectric material can be switched by application of an external electric field, studies for the use of ferroelectric materials in a nonvolatile memory device have been actively conducted. As an example, perovskite materials, which can manifest ferroelectric properties or characteristics, such as lead zirconate titanate (PZT) or strontium bismuth tantalite (SBT) have been studied for applications in nonvolatile memory devices.

In order for the technique to be effectively used in a nonvolatile memory device having a plurality of ferroelectric memory cells, during a read operation for a target memory cell or a write operation for a memory cell adjacent to the target memory cell, a target memory cell should reliably maintain a partially switched polarization orientation state.

SUMMARY

In an aspect of the present disclosure, a ferroelectric memory device includes a substrate having a source region and a drain region, a first ferroelectric material layer and a second ferroelectric material layer sequentially stacked on the substrate, and a gate electrode layer disposed on the second ferroelectric material layer. The second ferroelectric material layer has an oxygen vacancy concentration different from that of the first ferroelectric material layer.

In another aspect of the present disclosure, a ferroelectric memory device includes a substrate having a source region and a drain region, a first ferroelectric material layer and a second ferroelectric material layer that are sequentially disposed or stacked on the substrate, and a gate electrode layer disposed on the second ferroelectric material layer. The second ferroelectric material layer has a higher or greater oxygen vacancy concentration than that of the first ferroelectric material layer. A work function of the gate electrode layer is greater than an electron affinity of the second ferroelectric material layer.

In yet another aspect of the present disclosure, a method of manufacturing a ferroelectric memory device includes providing a substrate. A first ferroelectric film is formed on the substrate. A second ferroelectric film is formed on the first ferroelectric film. The second ferroelectric film has an oxygen vacancy concentration different from that of the first ferroelectric film. A conductive film is formed on the second ferroelectric film. The conductive film, the first and the second ferroelectric films, are patterned on the substrate.

DETAILED DESCRIPTION

Figure 1:
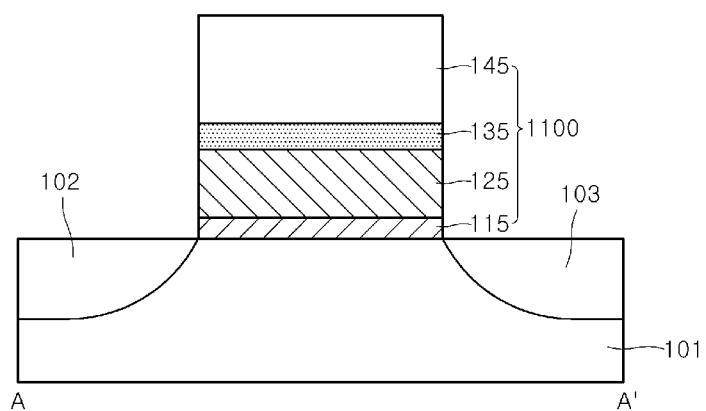
FIG. 1 is a cross-sectional view schematically illustrating the ferroelectric memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If a first element is referred to as located on a second element, it may be understood that the first element is directly located on the second element; that an additional element may be interposed between the first element and the second element; or that a portion of the first element is directly located on a portion of the second element. The same reference numerals may refer to the same elements throughout the specification.

In addition, expression of a singular form of a word includes the plural forms of the word unless clearly used otherwise in the context of the disclosure. The terms "comprise", "have", or "include" are intended to specify the presence of a feature, a number, a step, an operation, an element, a component, a part, or combinations thereof, but the terms do not preclude the presence or possibility of the addition of one or more other features, numbers, steps, operations, elements, components, parts, or combinations thereof.

Further, each step or process in a method or a manufacturing method need not be performed in any order set forth in the disclosure unless a specific sequence is explicitly described. In other words, each step or process in a method or manufacturing method disclosed herein may be performed sequentially in the stated order, may be performed out of sequence from the stated order, or may be performed substantially at the same time as one or more other steps or processes. The steps or processes may also be performed in a reverse order.

Recently, studies have been reported on techniques for securing a thin film having a ferroelectric property. As an example, J. Müller, et al. (*Nano Lett.*, 2012, 12 (8), pp 4318-4323) have disclosed that when an external electric field is applied to a pure zirconium oxide ($ZrO_2$) thin film, the thin film is transformed to have ferroelectric properties.

In an embodiment of the present disclosure, physical properties of a ferroelectric material layer, which can be a ferroelectric thin film, are manipulated and an internal electric field is formed or generated in the ferroelectric material layer. The internal electric field improves the remanent polarization orientation within the ferroelectric material layer. In an embodiment of the present disclosure, the thickness of the ferroelectric material layer may be reduced so that the internal electric field extends through at least a portion of the thickness of the ferroelectric material layer.

In an example, when the remanent polarization orientation is in one direction inside the ferroelectric material layer, the internal electric field improves and stabilizes the ferroelectric property of the ferroelectric material layer. The stabilization of the ferroelectric property of the ferroelectric material layer may, as an example, mean that the ferroelectricity of the ferroelectric material layer is prevented or inhibited from being transformed into a paraelectric or antiferroelectric property. The stabilization of the ferroelectric property of the ferroelectric material layer may, as another example, mean that defect dipoles randomly distributed by defects existing in the ferroelectric material layer are aligned in one direction to improve the ferroelectricity of the ferroelectric material layer. As a result, the ferroelectric material layer can stably maintain its ferroelectric property.

FIG. 1 is a cross-sectional view schematically illustrating a ferroelectric memory device according to an embodiment of the present disclosure. Referring to FIG. 1, ferroelectric memory device 10 may have a substrate 101 including a source region 102 and a drain region 103. The ferroelectric memory device 10 may include a gate structure 1100 disposed on the substrate 101. The gate structure 1100 may include a first ferroelectric material layer 125, a second ferroelectric material layer 135, and a gate electrode layer 145 that are sequentially stacked or disposed on the substrate. The gate structure 1100 may also include a gate insulation layer 115 between the substrate 101 and the first ferroelectric material layer 125.

The ferroelectric memory device 10 of the present embodiment is configured such that the remanent polarization orientation formed in the first and second ferroelectric material layers 125 and 135 can vary in accordance with the polarity or magnitude of a voltage applied to the gate electrode layer 145. The remanent polarization may induce electrons or holes in a channel region of the substrate 101 according to the remanent polarization orientation. The density of induced electrons or holes formed or generated in a channel region of the substrate 101 may vary depending on the remanent polarization orientation of the first and the second ferroelectric material layers 125 and 135. The density of the induced electrons or holes in the channel region results in varying electrical resistance in the channel region. The varying electrical resistance can be discriminated from each other and measured. Thus, a plurality of different electrical information can be stored in a nonvolatile manner.

Referring again to FIG. 1, the substrate 101 may include, for example, a semiconductor material. The substrate 101 may be a silicon substrate, a gallium arsenide substrate, an indium phosphide substrate, a germanium substrate, or a silicon germanium substrate, as non-limiting examples. The substrate 101 may be doped with n-type or p-type impurities to have conductivity.

The source region 102 and drain region 103 may be regions doped with n-type or p-type impurities. When the substrate 101 is doped with an n-type dopant or a p-type dopant, the source region 102 and drain region 103 may be doped with a dopant of an opposite type to that of substrate 101.

A gate insulation layer 115 may be disposed between the substrate 101 and the first ferroelectric material layer 125. The gate insulation layer 115 may suppress diffusion of materials between the substrate 101 and the first ferroelectric material layer 125. The gate insulation layer 115 may also control interfacial stress between the substrate 101 and the first ferroelectric material layer 125. The gate insulation layer 115 may include silicon oxide, silicon nitride, or silicon oxynitride, as non-limiting examples. The gate insulation layer 115 may have an amorphous state. In some embodiments, the gate insulation layer 115 may be omitted.

The first ferroelectric material layer 125 may be disposed on the gate insulation layer 115. The first ferroelectric material layer 125 may include a ferroelectric metal oxide. The ferroelectric metal oxide may include an oxide of a metal selected from hafnium, zirconium, or a combination of two or more thereof, as non-limiting examples.

The first ferroelectric material layer 125 may be doped with a dopant, or alternatively, the first ferroelectric material layer 125 is not doped. In an example, the first ferroelectric material layer 125 includes an oxide of a metal selected from hafnium, zirconium, or a combination thereof, and the first ferroelectric material layer 125 may include as a dopant carbon, silicon, magnesium, aluminum, yttrium, nitrogen, germanium, tin, strontium, lead, calcium, barium, titanium, zirconium, gadolinium, lanthanum, or a combination of two or more thereof, as non-limiting examples.

The second ferroelectric material layer 135 may be disposed on the first ferroelectric material layer 125. The second ferroelectric material layer 135 may include a ferroelectric metal oxide. As an example, the ferroelectric metal oxide may include an oxide of a metal selected from hafnium, zirconium, or a combination thereof. The second ferroelectric material layer 135 may be doped with a dopant, or alternatively, the second ferroelectric material layer 135 is not doped. In an example, the second ferroelectric material layer 135 includes an oxide of a metal selected from hafnium, zirconium, or a combination thereof, and the second ferroelectric material layer 135 may include as a dopant carbon, silicon, magnesium, aluminum, yttrium, nitrogen, germanium, tin, strontium, lead, calcium, barium, titanium, zirconium, gadolinium, lanthanum, or a combination of two or more thereof, as non-limiting examples.

In an embodiment, the second ferroelectric material layer 135 may include an oxide of the same metal element as that used in first ferroelectric material layer 125. As an example, each of the first and second ferroelectric material layers 125 and 135 may include hafnium oxide. As another example, each of the first and second ferroelectric material layers 125 and 135 may include zirconium oxide.

In another embodiment, the second ferroelectric material layer 135 may include an oxide of a metal element different from the first ferroelectric material layer 125. As an example, one of the first and second ferroelectric material layers 125 and 135 may include hafnium oxide, and the other layer may include zirconium oxide.

In an embodiment, the second ferroelectric material layer 135 may have a high oxygen vacancy concentration compared to that of the first ferroelectric material layer 125. Oxygen vacancies are conductive carriers that can provide electrons.

In an embodiment, as described below, during deposition of the second ferroelectric material layer 135, oxygen vacancies can be formed in the ferroelectric metal oxide by limiting the amount of oxygen necessary to form stoichiometrically stable metal oxide.

The gate electrode layer 145 may be disposed on the second ferroelectric material layer 135. In an embodiment, the work function of the gate electrode layer 145 may be greater than the electron affinity of the second ferroelectric material layer 135. Thus, a junction of, or an interface between, the gate electrode layer 145 and the second ferroelectric material layer 135 depletes the electrons of the second ferroelectric material layer 135, and consequently an electric field having a positive charge can be formed in the second ferroelectric material layer 135.

The work function of the gate electrode layer 145 may be greater than the electron affinity of the second ferroelectric material layer 135. For example, the difference may be about one electron volt (1 eV) or more. In another example, the second ferroelectric material layer 135 includes hafnium oxide and is ten nanometers (10 nm) thick. The work function of the gate electrode layer 145 is greater than the electron affinity of the second ferroelectric material layer 135 by one (1) eV. An internal electric field of about one mega electron volt per centimeter (1 MV/cm) can be generated in the second ferroelectric material layer 135. An internal electric field of about one (1) MV/cm can sufficiently stabilize the remanent polarization orientation of a second ferroelectric material layer 135 of about 10 nm thick.

In an embodiment, the gate electrode layer 145 may include tungsten, titanium, copper, aluminum, platinum, iridium, ruthenium, tungsten nitride, titanium nitride, tantalum nitride, iridium oxide, ruthenium oxide, tungsten carbide, titanium carbide, tungsten silicide, titanium silicide, tantalum silicide, or a combination of two or more thereof, as non-limiting examples.

In an embodiment, the thicknesses of the first and second ferroelectric material layers 125 and 135 are sufficiently reduced so that an electric field formed or generated inside the second ferroelectric material layer 135 can cover, or extend through at least a portion of the thicknesses of, the first and second ferroelectric material layers 125 and 135. As an example, the sum of the thickness of the first ferroelectric material layer 125 and the thickness of the second ferroelectric material layer 135 may be about four (4) nm to about 10 nm, and the ratio of the thickness of the first ferroelectric material layer 125 to the thickness of the second ferroelectric material layer 135 may be from about 8:1 to about 4:1.

In an example, the first ferroelectric material layer 125 may include hafnium oxide, and the second ferroelectric material layer 135 may include hafnium oxide having a higher or greater oxygen vacancy concentration compared to that of the first ferroelectric material layer 125. The gate electrode layer 145 may include titanium nitride.

Although it is not illustrated in FIG. 1, an interfacial oxide layer may be disposed at an interface of the second ferroelectric material layer 135 and the gate electrode layer 145. The interfacial oxide layer may be formed by inter-diffusion of the gate electrode layer 145 and the second ferroelectric material layer 135. The interfacial oxide layer may also be formed by trapping oxygen in the second ferroelectric material layer 135, so that additional oxygen vacancies may be formed in the second ferroelectric material layer 135.

As described above, in a ferroelectric memory device according to the present embodiment, a second ferroelectric material layer having a relatively high oxygen vacancy concentration is disposed on a first ferroelectric material layer, and a gate electrode layer having a work function greater than the electron affinity of the second ferroelectric material layer is bonded to, or in contact with, the second ferroelectric material layer. As a result, an internal electric field can be formed or generated in the first and second ferroelectric material layers. The internal electric field can improve and stabilize the remanent polarization orientation in the first and second ferroelectric material layers.

The ferroelectric characteristics of the first and second ferroelectric material layers can be stabilized by improving the remanent polarization orientation in one direction using the internal electric field. In an example, the stabilization of the ferroelectric characteristics of the first and second material layers may mean that the ferroelectricity of the first and second ferroelectric material layers is prevented or inhibited from changing to a paraelectric state or an antiferroelectric state. As another example, the stabilization of the ferroelectric characteristics of the first and second material layers may mean that the defect dipoles randomly distributed by the defects existing in the first and second ferroelectric material layers are aligned in one direction to improve the ferroelectricity of the first and second ferroelectric material layers.

Figure 2:
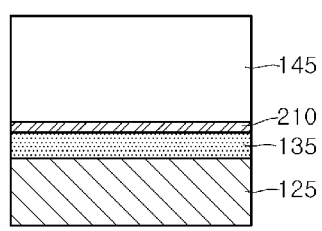
FIG. 2 is a cross-sectional view schematically illustrating a portion of a ferroelectric memory device according to an embodiment of the present disclosure.
Figure 3:
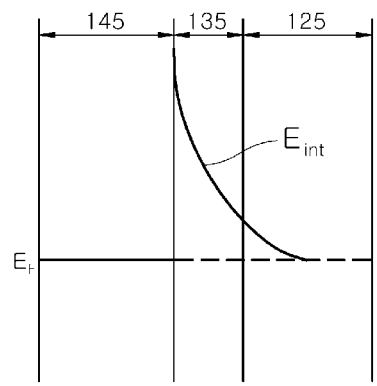
FIG. 3 is a schematic view illustrating an internal electric field of a ferroelectric material layer of a ferroelectric memory device according to an embodiment of the present disclosure.

FIG. 2 is a cross-sectional view taken along the line A-A' of FIG. 1A schematically illustrating a portion of a ferroelectric memory device according to an embodiment of the present disclosure. Specifically, FIG. 2 schematically illustrates an interface of a ferroelectric material layer and a gate electrode layer of the ferroelectric memory device. FIG. 3 is a schematic view illustrating an internal electric field of a ferroelectric material device according to an embodiment of the present disclosure.

In an embodiment, the ferroelectric memory device may include a silicon substrate, a gate dielectric layer including silicon oxide, a first ferroelectric material layer 125 including hafnium oxide, a second ferroelectric material layer 135 including hafnium oxide, and a gate electrode layer 145 including titanium nitride. In FIGS. 2 and 3, the silicon substrate and the gate dielectric layer are omitted for convenience.

Referring to FIG. 2, the second ferroelectric material layer 135 may include a high oxygen vacancy concentration in the hafnium oxide, as compared to that of the first ferroelectric material layer 125. The oxygen vacancies provide electrons as conductive carriers.

The gate electrode layer 145 includes a metal having high reactivity with oxygen. In an example, when the gate electrode layer 145 is disposed on the second ferroelectric material layer 135, the metal may react with oxygen in the second ferroelectric material layer 135 to form an interfacial oxide layer 210. In another example, the metal in the gate electrode layer 145 may diffuse into the second ferroelectric material layer 135 to form an interfacial oxide layer 210. In a further example, when the second ferroelectric material layer 135 includes hafnium oxide and the gate electrode layer 145 includes titanium nitride, a titanium oxide layer may be formed at an interface between the second ferroelectric material layer 135 and the gate electrode layer 145. The titanium oxide layer may deplete oxygen from hafnium oxide to increase the concentration of oxygen vacancies in the second ferroelectric material layer 135.

Referring to FIG. 3, in an embodiment, when second ferroelectric material layer 135 and the gate electrode layer 145 are in contact with each other, an internal electric field Ent may be generated in the first and second ferroelectric material layers 125 and 135. In an embodiment, the internal electric field Ent may extend from an interface between the gate electrode layer 145 and the second ferroelectric material layer 135 to inner regions of the first ferroelectric material layer 125 and the second ferroelectric material layer 135. In FIG. 3, the Fermi level $E_F$ is at the same level throughout the first and second ferroelectric material layers 125 and 135 and the gate electrode layer 145, when second ferroelectric material layer 135 and the gate electrode layer 145 are in contact with each other.

In an example, the titanium nitride of the gate electrode layer 145 may have a work function of about 4.4 eV to about 4.6 eV, and the electron affinity of the hafnium oxide of the second ferroelectric material layer 135 may have a value of about 1.75 eV to about 2.25 eV. Therefore, the work function of the gate electrode layer 145 is greater than the electron affinity of the second ferroelectric material layer 135. After the gate electrode layer 145 and the second ferroelectric material layer 135 are in contact with each other, electrons serving as conductive carriers in the second ferroelectric material layer 135 may be depleted. A depletion layer having positive charges forms inside the second ferroelectric material layer 135. An internal electric field $E_{int}$ covering the first and second ferroelectric material layers 125 and 135 is generated by the depletion layer. In some cases, the thicknesses of the first and second ferroelectric material layers 125 and 135 may be controlled so that the internal electric field $E_{int}$ covers, or extends through at least a portion of, the first and second ferroelectric material layers 125 and 135. As an example, the sum of the thickness of the first ferroelectric material layer 125 and the thickness of the second ferroelectric material layer 135 may be four (4) nm to ten (10) nm. The ratio of the thickness of the first ferroelectric material layer 125 to the thickness of the second ferroelectric material layer 135 may be from 8:1 to 4:1.

An internal electric field $E_{int}$ can improve the remanent polarization orientation in the first and second ferroelectric material layers 125 and 135. As the remanent polarization orientation in one direction is improved by the internal electric field $E_{int}$, the ferroelectric characteristic of the first and second ferroelectric material layers 125 and 135 is stabilized. The stabilization of the ferroelectric characteristics of the first and second material layers 125 and 135 may mean, as an example, that the ferroelectric property of the first and second ferroelectric material layers 125 and 135 is prevented or inhibited from being transformed to a paraelectric property or an antiferroelectric property. As another example, the stabilization of the ferroelectric characteristics of the first and second material layers 125 and 135 may mean that defect dipoles randomly distributed by defects existing in the first and second ferroelectric material layers 125 and 135 are aligned in one direction to improve the ferroelectric properties of the first and second ferroelectric material layers 125 and 135.

In some other embodiments, although it is not illustrated, the second ferroelectric material layer 135 may be disposed on the gate insulation layer 115 and the first ferroelectric material layer 125 may be disposed on the second ferroelectric material layer 135. The gate electrode layer 145 may be disposed on the first ferroelectric material layer 125. Since the second ferroelectric material layer 135 has a higher or greater oxygen vacancy concentration than the first ferroelectric metal oxide layer 125, an internal electric field can be formed in the first and second ferroelectric material layers, as described above. At this time, the gate electrode layer 145 may have a work function greater than or equal to an electron affinity of the first ferroelectric material layer 125.

Figure 4:
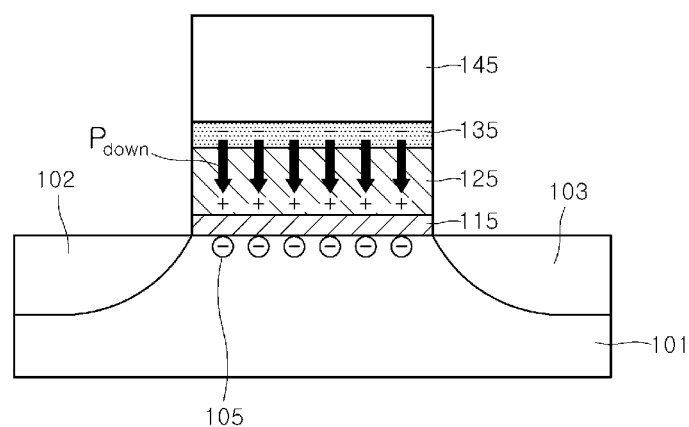
FIGS. 4 and 5 are cross-sectional views schematically illustrating operations of a ferroelectric memory device according to embodiments of the present disclosure.
Figure 5:
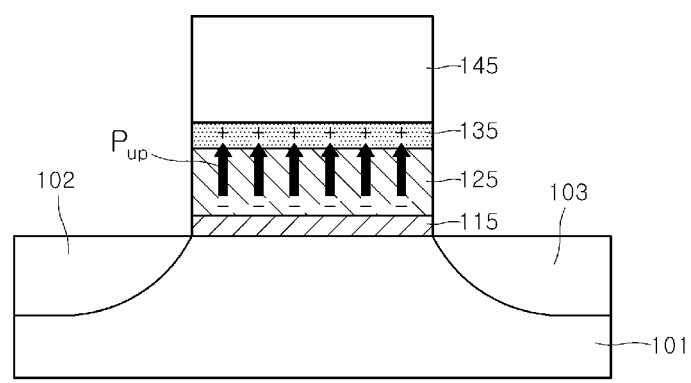

FIGS. 4 and 5 are cross-sectional views schematically illustrating operations of a ferroelectric memory device according to embodiments of the present disclosure. A configuration of the ferroelectric memory device of FIGS. 4 and 5 may be substantially the same as a configuration of ferroelectric memory device 10 described above and with reference to FIGS. 1A and 1B.

Referring to FIG. 4, a predetermined programming voltage may be applied to a gate electrode layer 145. The programming voltage may have a positive bias. The programming voltage may orient the remanent polarization in a first and a second ferroelectric material layers 125 and 135 in a direction $P_{down}$ towards a substrate 101. The orientation of remanent polarization $P_{down}$ may induce electrons 105 in a channel region of the substrate 101 to reduce a channel resistance between a source region 102 and a drain region 103. As an example, a state in which the orientation of remanent polarization $P_{down}$ is formed in the first and second ferroelectric material layers 125 and 135 in the direction of the substrate 101 may be referred to as a first logic information.

Referring to FIG. 5, in an embodiment, a predetermined erase voltage may be applied to the gate electrode layer 145. The erase voltage may have a negative bias. The erase voltage may orient the remanent polarization in the first and the second ferroelectric material layers 125 and 135 in a direction $P_{up}$ towards gate electrode layer 145. The orientation of remanent polarization $P_{up}$ may expel electrons 105 from the channel region of the substrate 101. As a result, channel resistance between the source region 102 and drain region 103 can be increased. In an example, a state in which the orientation of remanent polarization $P_{up}$ is formed in the direction of the gate electrode layer 145 in the first and second ferroelectric material layers 125 and 135 may be referred to as a second logic information.

In an embodiment of the present disclosure, a first or a second logic information can be stored depending on the orientation of remanent polarization ($P_{down}$ or $P_{up}$) in the first and second ferroelectric material layers 125 and 135. As described above, the internal electric field Ent formed in the first and second ferroelectric material layers 125 and 135 can improve the orientation of remanent polarization ($P_{down}$ or $P_{up}$) in the first and second ferroelectric material layers 125 and 135 to stabilize the ferroelectricity of the first and second ferroelectric material layers 125 and 135.

Figure 6:
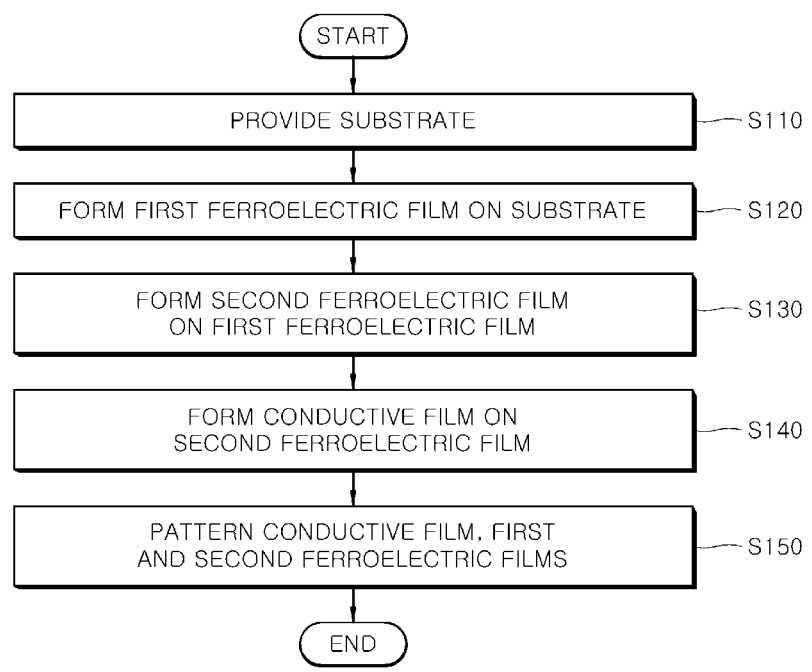
FIG. 6 is a flow chart illustrating a method of manufacturing a ferroelectric memory device according to an embodiment of the present disclosure.

FIG. 6 is a flow chart schematically illustrating a method of manufacturing a ferroelectric memory device according to an embodiment of the present disclosure. FIGS. 7 to 11 are cross-sectional views schematically illustrating a method of manufacturing a ferroelectric memory device according to an embodiment of the present disclosure.

Figure 7:
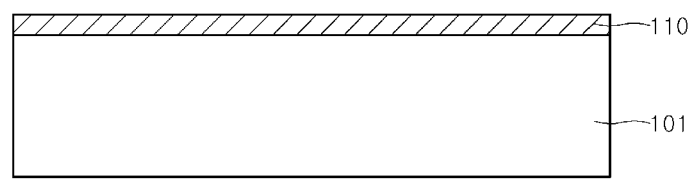
FIGS. 7 to 11 are cross-sectional views schematically illustrating a method of manufacturing a ferroelectric memory device according to an embodiment of the present disclosure.

Referring to step S110 of FIG. 6 and FIG. 7, in an embodiment, a substrate 101 may be provided. The substrate 101 may, for example, include a semiconductor material. The substrate 101 may be a silicon substrate, a gallium arsenide substrate, an indium phosphide substrate, a germanium substrate, or a silicon germanium substrate, as non-limiting examples. The substrate 101 may be doped with n-type or p-type impurities to have conductivity.

Next, as illustrated in FIG. 7, an insulation film 110 may be formed on the substrate 101. The insulation film 110 suppresses diffusion of materials between a first ferroelectric film 120, described later, and the substrate 101. The insulation film 110 may also control interfacial stress between the first ferroelectric film 120 and the substrate 101.

The insulation film 110 may include silicon oxide, silicon nitride, or silicon oxynitride, as non-limiting examples. The insulation film 110 may be formed using a chemical vapor deposition method, an atomic layer deposition method, a coating method or the like, as non-limiting examples. In some embodiments, a process for forming the insulation film 110 may be omitted.

Figure 8:
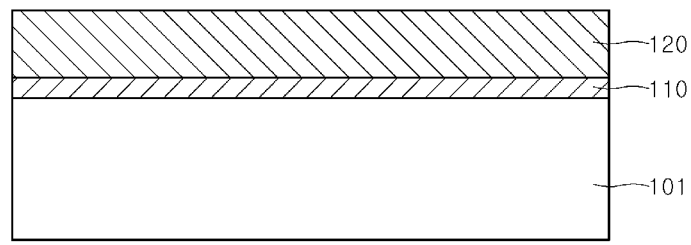

Referring to step S120 of FIG. 6 and FIG. 8, the first ferroelectric film 120 may be formed on the insulation film 110. The first ferroelectric film 120 may include a ferroelectric metal oxide. As an example, the ferroelectric metal oxide may include oxide of a metal selected from hafnium, zirconium or a combination thereof.

In an embodiment, the first ferroelectric film 120 may be formed by an atomic layer deposition method, a chemical vapor deposition method, a molecular beam deposition method, an evaporation method or the like, as non-limiting examples. In an embodiment, the process of forming the first ferroelectric film 120 may include depositing the first metal oxide thin film using a first source including at least one of hafnium and zirconium and a second source including oxygen.

The first ferroelectric film 120 may be doped with a dopant. In an example, when the first ferroelectric film 120 is formed with an oxide of a metal selected from hafnium, zirconium, or a combination thereof, the method includes doping the first ferroelectric film 120 with an element such as carbon, silicon, magnesium, aluminum, yttrium, nitrogen, germanium, tin, strontium, lead, calcium, barium, titanium, zirconium, gadolinium, lanthanum, or a combination thereof, as non-limiting examples.

In another embodiment, the first ferroelectric film 120 is not doped. In such cases, during the deposition process, the material sources do not include a dopant during forming of the first ferroelectric film 120, and the film is not doped.

Figure 9:
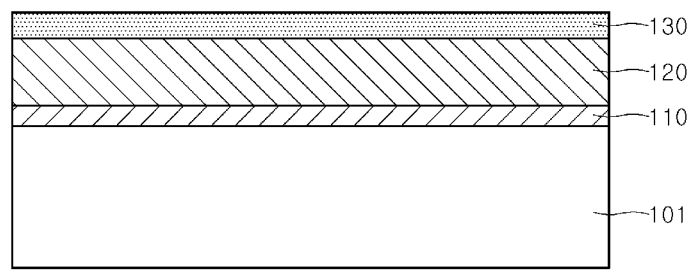

Referring to step S130 of FIG. 6 and FIG. 9, a second ferroelectric film 130 may be formed on the first ferroelectric film 120. In an embodiment, the second ferroelectric film 130 may have an oxygen vacancy concentration different from that of the first ferroelectric film 120. As an example, the second ferroelectric film 130 may have a higher or greater oxygen vacancy concentration than that of the first ferroelectric film 120. In an embodiment, the second ferroelectric film 130 may include a ferroelectric metal oxide. As an example, the ferroelectric metal may include oxide of a metal selected from hafnium, zirconium or a combination thereof.

In an embodiment, the second ferroelectric film 130 may include an oxide of the same metal element as that of the first ferroelectric film 120. As an example, the first and second ferroelectric films 120 and 130 may each include hafnium oxide. As another example, each of the first and second ferroelectric films 120 and 130 may include zirconium oxide.

In another embodiment, the second ferroelectric film 130 may include an oxide of a different metal element from that of the first ferroelectric film 120. As an example, one of the first and second ferroelectric films 120 and 130 may include hafnium oxide, and the other may include zirconium oxide.

In the second ferroelectric film 130 may be formed by an atomic layer deposition method, a chemical vapor deposition method, a molecular beam deposition method, an evaporation method or the like, as non-limiting examples. In an embodiment, a process of forming the second ferroelectric film 130 may include depositing a second metal oxide thin film using a first source including at least one of hafnium and zirconium and a second source including oxygen. In depositing the second metal oxide thin film, oxygen vacancies can be generated in the second ferroelectric film 130 by supplying less oxygen than necessary, or limiting the amount of oxygen required, to satisfy the stoichiometric ratio of the metal oxide thin film.

In another embodiment, the second ferroelectric film 130 is formed of a metal oxide thin film using a first source (including at least one of hafnium and zirconium) and a second source (including oxygen). After the formation of the second ferroelectric film 130, a metal having a valence value smaller than the valence value of a metal of second ferroelectric film 130 is implanted to generate oxygen vacancies. As an example, when the second ferroelectric film 130 includes hafnium oxide or zirconium oxide, the implanted metal may have a valence value of +3. The metal may be scandium, yttrium, lanthanum, actinium, or the like, as non-limiting examples.

In another embodiment, the second ferroelectric film 130 is formed of a metal oxide thin film using a first source and a second source. After the formation of the metal oxide thin film, the surface of the metal oxide thin film is nitrided to form a metal oxynitride layer. The metal oxynitride layer functions as a thin film having oxygen vacancies.

In an embodiment, the first and second ferroelectric films 120 and 130 may include hafnium oxide. After the first ferroelectric film 120 is formed using an atomic layer deposition method, the method is continued and forms second ferroelectric film 130 in an in-situ process. In an example, the first source containing hafnium includes tetrakis-(ethylmethylamino)-hafnium (TEMA-Hf) or hafnium tetrachloride (HfCl$_4$). The second source containing oxygen includes ozone. In an example, the first and second ferroelectric films 120 and 130 including hafnium oxide may be formed at about 200 degrees Celcius (° C.) to 300° C.

According to an embodiment, when the second ferroelectric film 130 is formed in an in-situ process, the concentration of oxygen vacancies in the hafnium oxide can be increased by relatively reducing the amount of the second source that was used in forming the first ferroelectric film 120.

According to another embodiment, after forming the second ferroelectric film 130, the concentration of oxygen vacancies in the second ferroelectric film 130 can be increased by implanting metal elements such as scandium, yttrium, lanthanum, actinium, or the like, as non-limiting examples.

According to another embodiment, after forming the second ferroelectric film 130, the surface of the second ferroelectric film 130 may be nitrided. For example, the second ferroelectric film 130 may form a hafnium oxynitride layer including oxygen vacancies. The hafnium oxynitride layer may provide oxygen vacancies to the second ferroelectric film 130.

In embodiments, the sum of the thickness of the first ferroelectric film 120 and the thickness of the second ferroelectric film 130 may be from about four (4) nm to about ten (10) nm. The thickness ratio of the first ferroelectric film 120 to the second ferroelectric film 130 may be from about 8:1 to about 4:1. As an example, the first ferroelectric film 120 may be formed to a thickness of about eight (8) nm, and the second ferroelectric film 130 may be formed to with a thickness of about two (2) nm.

Figure 10:
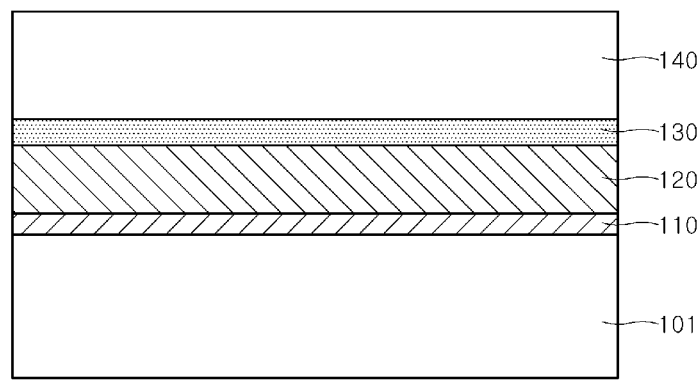

Referring to step S140 of FIG. 6 and FIG. 10, a conductive film 140 may be formed on the second ferroelectric film 130. In an embodiment, the conductive film 140 may have a work function greater than the electron affinity of the second ferroelectric film 130. In an embodiment, the conductive film 140 may include tungsten, titanium, copper, aluminum, platinum, iridium, ruthenium, tungsten nitride, titanium nitride, tantalum nitride, iridium oxide, ruthenium oxide, tungsten carbide, titanium carbide, tungsten silicide, titanium silicide, tantalum silicide, or a combination of two or more thereof, as non-limiting examples.

The conductive film 140 may, for example, be formed by a chemical vapor deposition method, an atomic layer deposition method, or a sputtering method, as non-limiting examples. In an embodiment, when each of the first and second ferroelectric films 120 and 130 includes hafnium oxide, the conductive film 140 may include titanium nitride. The titanium nitride may, for example, be formed by a chemical vapor deposition method using titanium chloride ($TiCl_4$) and ammonium ($NH_3$) as source gases. The conductive film 140 including the titanium nitride may be formed at a process temperature of about 400° C. to about 600° C.

Although it is not illustrated, in the process of forming the conductive film 140, an interfacial oxide layer that facilitates the generation of oxygen vacancies may be formed between the conductive film 140 and the second ferroelectric film 130. In an example, when the conductive film 140 includes titanium nitride and the second ferroelectric film 130 includes hafnium oxide, a titanium oxide layer may be formed as the interfacial oxide layer. The titanium oxide layer may deplete oxygen from the hafnium oxide to generate oxygen vacancies.

In some embodiments, in the process of forming the conductive film 140, the first and the second ferroelectric films 120 and 130 may be crystallized. The process temperature for forming the conductive film 140 may be equal to or higher than the crystallization temperature of the first and second ferroelectric films 120 and 130. Through the crystallization, the ferroelectric properties of the first and second ferroelectric films 120 and 130 can be increased or improved.

Figure 11:
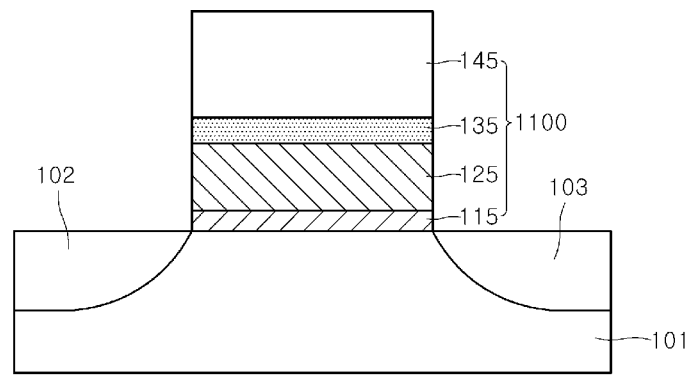

Referring to step S150 of FIG. 6 and FIG. 11, the conductive film 140, the first and second ferroelectric films 120 and 130, and the insulation film 110 may be patterned to form a gate structure 1100. As an example, the gate structure 1100 may include the gate insulation layer 115, the first ferroelectric material layer 125, the second ferroelectric material layer 135 and the gate electrode layer 145.

Next, dopants may be implanted into the substrate 101 at respective ends or sides of the gate structure 1100, and in upper portions of substrate 101, to form source and drain regions 102 and 103. The source and drain regions 102 and 103 may be doped with a doping type opposite to a doping type of the substrate 101.

In some embodiments, after forming the conductive film 140, a crystallization heat treatment for the first and second ferroelectric films 120 and 130 may be further performed. Through crystallization, the ferroelectric properties of the first and second ferroelectric films 120 and 130 can be improved or increased.

By performing the above described processes, a ferroelectric memory device according to an embodiment of the present disclosure can be manufactured. The ferroelectric memory device may include first and second ferroelectric material layers, having a first ferroelectric metal oxide layer and a second ferroelectric metal oxide layer respectively, and a gate electrode layer that are sequentially stacked or formed on a substrate. The second ferroelectric metal oxide layer may be formed to have a higher or greater oxygen vacancy concentration than the first ferroelectric metal oxide layer.

Therefore, when the gate electrode layer and the second ferroelectric material layer are in contact with each other, an electric field is formed extending from an interface between the gate electrode layer and the second ferroelectric material layer to inner regions of the first and second ferroelectric material layers. The electric field can improve the remanent polarization orientation of the first and second ferroelectric material layers and stabilize their ferroelectric properties.

Although it is not illustrated, in some other embodiment, in a process of forming the first ferroelectric film 120 and the second ferroelectric film 130, the second ferroelectric film 130 may be formed on the insulation film 110 and the first ferroelectric film 120 may be formed on the second ferroelectric film 130. The conductive film 140 may be formed on the second ferroelectric film 130. After that, the conductive film 140, the first and second ferroelectric films 120 and 130, and the insulation film 110 may be patterned to form a gate structure. Next, dopants may be implanted into the substrate 101 at respective ends or sides of the gate structure, and in upper portions of substrate 101, to form source and drain regions 102 and 103.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A ferroelectric memory device comprising:
   a substrate having a source region and a drain region;
   a first ferroelectric material layer and a second ferroelectric material layer that are sequentially stacked on the substrate; and
   a gate electrode layer disposed on the second ferroelectric material layer,
   wherein the second ferroelectric material layer has a higher oxygen vacancy concentration than that of the first ferroelectric material layer,
   wherein a work function of the gate electrode layer is greater than an electron affinity of the second ferroelectric material layer.

2. The ferroelectric memory device of claim 1, wherein at least one of the first ferroelectric material layer and the second ferroelectric material layer comprises a dopant, and the dopant comprises at least one selected from carbon, silicon, magnesium, aluminum, yttrium, nitrogen, germanium, tin, strontium, lead, calcium, barium, titanium, zirconium, gadolinium, and lanthanum.

3. The ferroelectric memory device of claim 1, wherein the gate electrode layer comprises at least one selected from tungsten, titanium, copper, aluminum, platinum, iridium, ruthenium, tungsten nitride, titanium nitride, tantalum nitride, iridium oxide, ruthenium oxide, tungsten carbide, titanium carbide, tungsten silicide, titanium silicide, and tantalum silicide.

4. The ferroelectric memory device of claim 1, wherein a sum of the thickness of the first ferroelectric material layer and the thickness of the second ferroelectric material layer is 4 nm to 10 nm.

5. The ferroelectric memory device of claim 4, wherein a ratio of the thickness of the first ferroelectric material layer and the thickness of the second ferroelectric material layer is 8:1 to 4:1.

6. The ferroelectric memory device of claim 1, further comprising
a gate insulation layer disposed between the substrate and the first ferroelectric material layer.

7. The ferroelectric memory device of claim 1, wherein each of the first and second ferroelectric material layers comprises at least one of hafnium oxide and zirconium oxide.

8. The ferroelectric memory device of claim 7, wherein the gate electrode layer comprises at least one selected from tungsten, titanium, copper, aluminum, platinum, iridium, ruthenium, tungsten nitride, titanium nitride, tantalum nitride, iridium oxide, ruthenium oxide, tungsten carbide, titanium carbide, tungsten silicide, titanium silicide, and tantalum silicide.

9. The ferroelectric memory device of claim 8, further comprising an interfacial insulation layer disposed between the second ferroelectric material layer and the gate electrode layer.

* * * * *